United States Patent
Kuo

(10) Patent No.: US 8,354,747 B1
(45) Date of Patent: Jan. 15, 2013

(54) CONDUCTIVE POLYMER LID FOR A SENSOR PACKAGE AND METHOD THEREFOR

(75) Inventor: Bob Shih-Wei Kuo, Chandler, AZ (US)

(73) Assignee: Amkor Technology, Inc, Chandler, AZ (US)

( * ) Notice: Subject to any disclaimer, the term of this patent is extended or adjusted under 35 U.S.C. 154(b) by 93 days.

(21) Appl. No.: 12/791,472

(22) Filed: Jun. 1, 2010

(51) Int. Cl.
*H01L 23/12* (2006.01)

(52) U.S. Cl. ........ 257/704; 257/684; 257/733; 257/783; 257/778; 257/738; 438/121; 438/108; 438/119; 438/613

(58) Field of Classification Search .................. 257/704, 257/706, 723, 734, 731, 733, 724, 678, 787, 257/737, 738, 779, 780, 781, 782, 783, 784, 257/666, 670, 672, 674, 675, 676, 677, 685, 257/659, 660, 416, 707, 710, 713, 732, 684, 257/686, 690, 778, 786; 438/121, 109, 110, 438/108, 118, 119, 125, 106, 122, 612, 613, 438/614

See application file for complete search history.

(56) References Cited

U.S. PATENT DOCUMENTS

| | | | |
|---|---|---|---|
| 6,376,907 B1 * | 4/2002 | Takano et al. ................. | 257/704 |
| 6,522,762 B1 | 2/2003 | Mullenborn et al. | |
| 6,781,231 B2 | 8/2004 | Minervini | |
| 7,166,910 B2 | 1/2007 | Minervini | |
| 7,242,089 B2 | 7/2007 | Minervini | |
| 7,381,049 B2 | 6/2008 | Li et al. | |
| 7,381,589 B2 | 6/2008 | Minervini | |
| 7,434,305 B2 | 10/2008 | Minervini | |
| 7,439,616 B2 | 10/2008 | Minervini | |
| 7,501,703 B2 | 3/2009 | Minervini | |
| 7,537,964 B2 | 5/2009 | Minervini | |
| 7,668,415 B2 * | 2/2010 | Tyger ............................. | 385/14 |
| 8,018,049 B2 | 9/2011 | Minervini | |
| 2006/0157841 A1 | 7/2006 | Minervini | |
| 2007/0004083 A1 * | 1/2007 | Chiu et al. ..................... | 438/106 |
| 2007/0013052 A1 * | 1/2007 | Zhe et al. ....................... | 257/704 |
| 2007/0090502 A1 * | 4/2007 | Zhao et al. .................... | 257/675 |
| 2007/0215962 A1 | 9/2007 | Minervini et al. | |
| 2007/0222064 A1 * | 9/2007 | Edwards et al. ............... | 257/704 |
| 2007/0296075 A1 * | 12/2007 | Kwon et al. .................... | 257/706 |
| 2008/0150104 A1 * | 6/2008 | Zimmerman et al. ......... | 257/676 |
| 2010/0176509 A1 * | 7/2010 | Murai et al. ................... | 257/737 |

* cited by examiner

*Primary Examiner* — Ha Tran T Nguyen
*Assistant Examiner* — Thanh Y Tran
(74) *Attorney, Agent, or Firm* — McAndrews, Held & Malloy, Ltd.

(57) ABSTRACT

A semiconductor device has a base substrate having a plurality of metal traces. A conductive polymer cover is provided having an opening. The conductive polymer cover forms a cavity when attached to the base substrate. At least one die is attached to an interior surface of the conductive polymer cover and positioned over the opening. The conductive polymer cover and the at least one die are electrically coupled to metal traces on the first surface of the base substrate.

19 Claims, 3 Drawing Sheets

CONDUCTIVE POLYMER LID FOR A SENSOR PACKAGE AND METHOD THEREFOR

FIELD OF THE INVENTION

This invention relates to a sensor package, and, more specifically, to a system and method of coupling a conductive polymer lid for providing radio frequency (RF) shielding to a sensor package.

BACKGROUND OF THE INVENTION

Many sensor packages may require cavities for stress or vibration isolation (i.e., gyroscopes) or to provide acoustic volume. For example, acoustic performance in a micro-electro-mechanical system (MEMS) based microphone device may require an acoustic chamber in the package and an open port to the chamber to receive sound wave input. MEMS devices exist where the port is either on the top or bottom of the package.

In a sensor package that may require a cavity, radio frequency (RF) shielding may be required to protect the package from interference from electromagnetic noise signals. Such designs generally use a formed metal lid or a molded plastic lid with conductive metal plating to form the cavity structure and to provide adequate RF shielding. In some sensor packages, such as in a MEMS microphone, it is desirable to install an acoustic seal to segregate the front and back volume for better single to noise ratio. Current designs either suffer from reduced sensitivity or increased noise as a result of limited back volume, poor or no isolation of back volume, or impeded access to the back volume through a small channel internal to the substrate.

Therefore, a need existed to provide a system and method to overcome the above problem.

BRIEF DESCRIPTION OF THE DRAWINGS

Common reference numerals are used throughout the drawings and detailed description to indicate like elements.

DETAILED DESCRIPTION

Generally described, the present application relates to a semiconductor device. The semiconductor device has a base substrate having a plurality of metal traces. A conductive polymer cover is provided having an opening. The conductive polymer cover forms a cavity when attached to the base substrate. At least one die is attached to an interior surface of the conductive polymer cover and positioned over the opening. The conductive polymer cover and the at least one die are electrically coupled to metal traces on the first surface of the base substrate.

Further, the patent application relates to a method of forming a semiconductor device. The method comprises: forming a conductive polymer lid having an opening formed in a top surface thereof; attaching a semiconductor die to an interior of the top surface of the conductive polymer lid and over the opening to form a seal over the opening; and flip attaching the conductive polymer lid and the semiconductor die to a first surface of a substrate.

Figure 1:
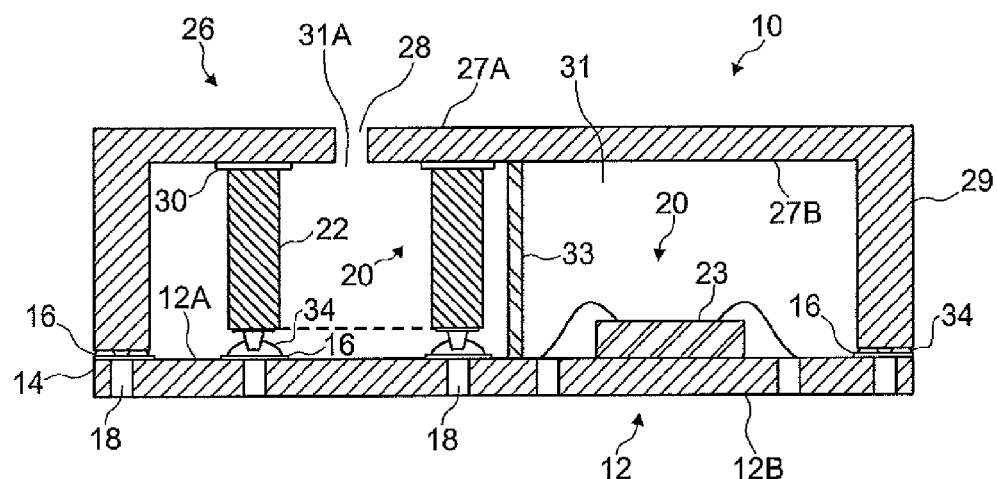
FIG. 1 is a cross-sectional side view of one embodiment of a sensor package.
Figure 2:
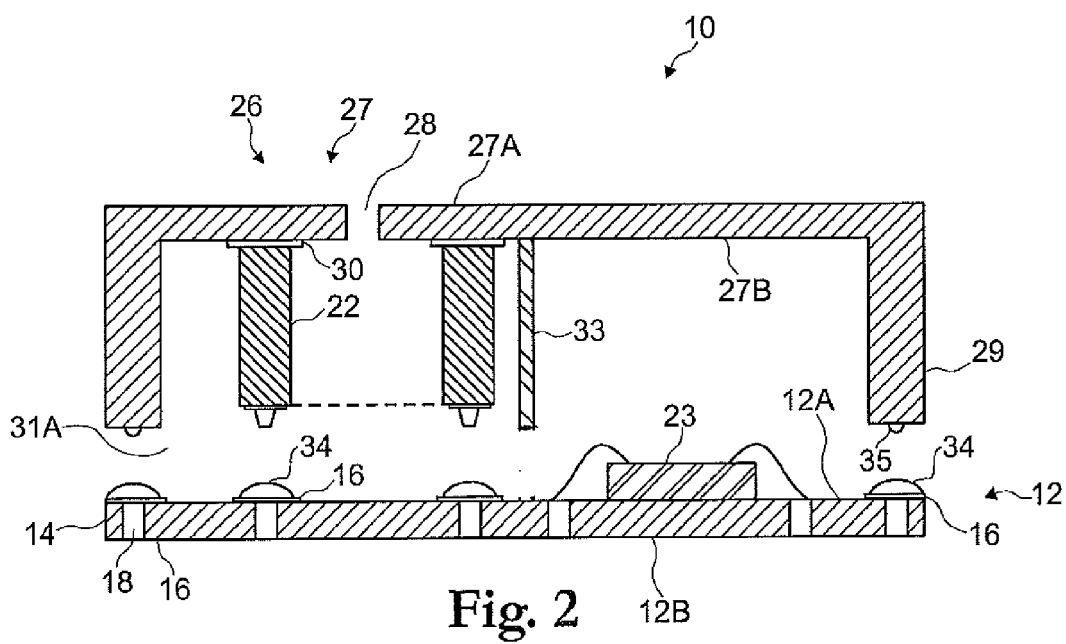
FIG. 2 is an exploded cross-sectional side view of the sensor package of FIG. 1.

Referring to FIGS. 1 and 2, a cross-sectional side view of a semiconductor device 10 (hereinafter device 10) of the present invention is shown. The device 10 may have a base substrate 12 having an approximately planar first surface 12A and an approximately planar second surface 12B opposing the first surface 12A. The base substrate 12 may be any one chosen from a conventional rigid PCB, a flexible PCB, a ceramic or an equivalent thereof, and the like, but the kind of base substrate 12 is not limited herein.

The base substrate 12 may include an insulation layer 14 having predetermined area and thickness. The insulation layer 14 may have an approximately planar first surface and an approximately planar second surface opposing the first surface. The insulation layer 14 may have one or more metal traces 16 formed thereon. In the embodiment shown in FIG. 1, the insulation layer 14 may have metal traces 16 formed on the first and second surface of the insulation layer 14. However, the number of metal traces 16 is not limited to the number shown in FIG. 1. In general, the insulation layer 14 may have multiple layers of metal traces 16 formed therein. When multiple layers of metal traces 16 are formed in the insulation layer 14, a dielectric layer may be applied between the layers of metal traces 16. The dielectric layer may be used as an insulating layer to separate the layers of metal traces 16. A soldermask may be placed over the top surface of the metal traces 16 to protect the metal traces 16. One or more vias 18 may be formed through the base substrate 12. The vias 18 may be plated or filled with a conductive material.

The semiconductor device 10 may have at least one electronic component 20. The electronic component 20 may be a transducer, a microphone, a pressure sensor, and the like. The listing of the above is given as an example and should not be seen in a limiting manner. In the present embodiment, the electronic component is a sensor die 22. In the embodiment shown, multiple semiconductor devices 10 are shown, a sensor die 22 and a control die 23. However, this should not be seen in a limiting manner.

The semiconductor device 10 may have a lid member 26. The lid member 26 forms a cavity 31 when positioned on and attached to the first surface 12A of the base substrate 12. The lid member 26 may have a top lid section 27. The top lid section 27 may have an approximately planar first surface 27A and an approximately planar second surface 27B opposing the first surface 27A. Side walls 29 may extend down from the second surface 27B to form the cavity 31. Additional compartmental walls 33 may extend down from the second surface 27B to form compartments 31A within the cavity 31.

The lid member 26 may be formed of a conductive polymer material. In accordance with one embodiment, a polymer material is mixed with conductive metal flakes to form the conductive polymer material. By using a conductive polymer material, the lid member 26 does not require any additional coating for RF shielding like the plastic lids used in the prior art. The lid member 26 may be formed by molding, printing, casting, and the like. The above mentioned methods are given as an example and should not be seen in a limiting manner.

The sensor die 22 may be attached to the second surface 27B of the top lid section 27. In the embodiment shown in FIGS. 1 and 2, the sensor die 22 is positioned on the second surface 27B and positioned over an opening 28 formed through the top lid section 27. The opening 28 allows the sensor die 22 to accurately receive signal. For example, if the sensor die 22 was a transducer, the opening 28 may be used to monitored sound waves and convert the sound waves to electrical signals and further provide a pressure reference for the transducer. The sensor die 22 maybe attached to the second surface 27B of the top lid section 27 by an adhesive 30. The adhesive 30 may be an adhesive paste, adhesive tape, or the like. The listing of the above is given as an example and should not be seen in a limiting manner. Securing the sensor die 22 to the second surface 27B of the top lid section 27 by the adhesive 30 eliminates the need for an acoustic seal.

The control die 23 is electrically coupled to the first surface 12A of the base substrate 12. Different methods may be used to electrically couple the control die 23 to the substrate 12. Wirebonds, surface mount technology, through hole technology, flip chip technology, and the like may be used. The listing of the above is given as an example and should not be seen in a limiting manner. In the embodiment shown, the control die 23 is wirebonded to the metal traces 16 formed on the first surface 12A of the base substrate 12.

The lid member 26, with the sensor die 22 attached, may then be coupled to the first surface 12A of the base substrate 12. In general, the sensor die 22 and the lid member 26 may be attached to metal traces 16 formed on the first surface 12A of the base substrate 12.

Figure 3:
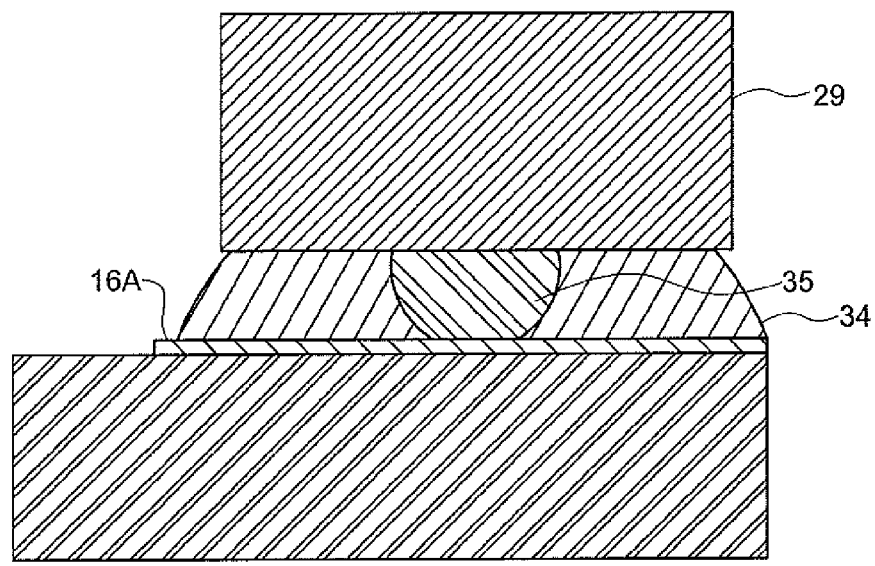
FIG. 3 is a magnified cross-sectional side view of the inter-connect between the conductive polymer lid and the substrate.

As shown in FIGS. 1-3, the distal ends of the side walls 29 may be attached to the metal traces 16 formed on the first surface 12A of the base substrate 12. In general, the distal ends of the side walls 29 are attached to grounded metal traces 16A. A conductive adhesive 34 is applied to the grounded metal traces 16A to which the side walls 29 are to be attached. In accordance with one embodiment, the conductive adhesive 34 is a conductive epoxy, solder paste, or the like. The listing of the above is given as an example and should not be seen in a limiting manner. Pressure is applied so that the distal ends of the side walls 29 are electrically coupled to the grounded metal trace 16A.

As shown more clearly in FIG. 3, the lid member 26 may have a bump structure 35 formed on the distal end of the side walls 29. The bump structure 35 may be formed on a central area on a bottom surface of the side walls 29. The bump structure 35 allows one to control the Bond Line Thickness (BLT). This allows one to compensate for discrepancies and or in warpage in the lid member 26 when the lid member 26 was formed.

Figure 4:
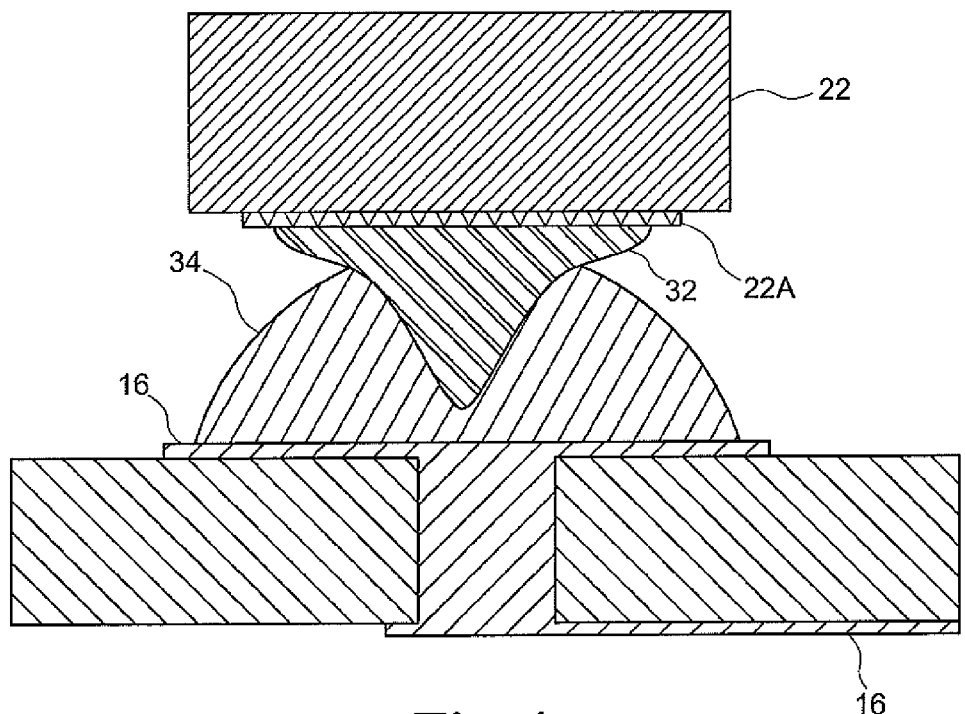
FIG. 4 is a magnified cross-sectional side view of the inter-connect between the sensor die and the substrate.

The sensor die 22 may be attached to the base substrate 12 in a plurality of different manners. As shown in FIG. 4, the sensor die 22 is attached to the substrate 12 via a stud bump process. Stud bumps 32 may be formed on bond pads 22A of the sensor die 22. In accordance with one embodiment, the stud bump 32 is a gold stud bump. The conductive adhesive 34 is applied to the metal traces 16 to which the sensor die 22 is to be attached. In accordance with one embodiment, the conductive adhesive 34 is a conductive epoxy, solder paste, or the like. The listing of the above is given as an example and should not be seen in a limiting manner. Pressure is applied so that the stud bumps 32 are electrically coupled to the metal trace 16.

Figure 5:
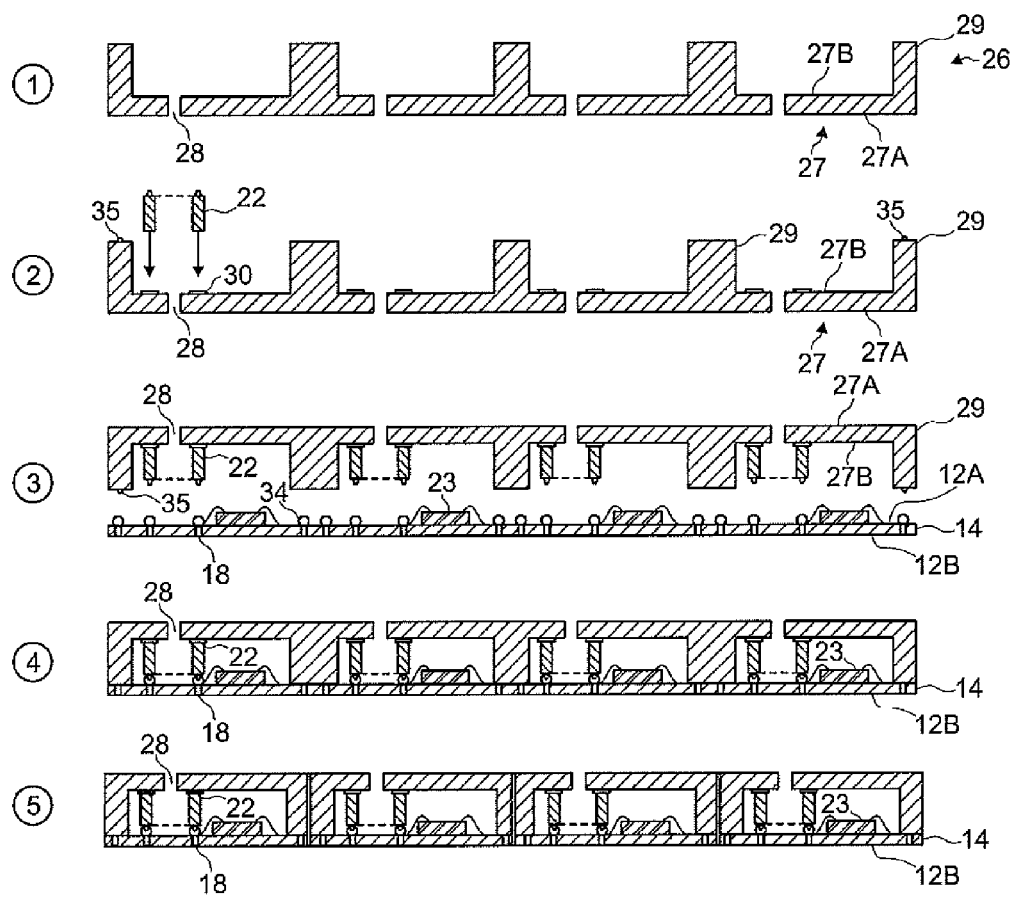
FIG. 5 is a cross-sectional side view depicting a method of forming the sensor package depicted in FIG. 1.
Figure 6:
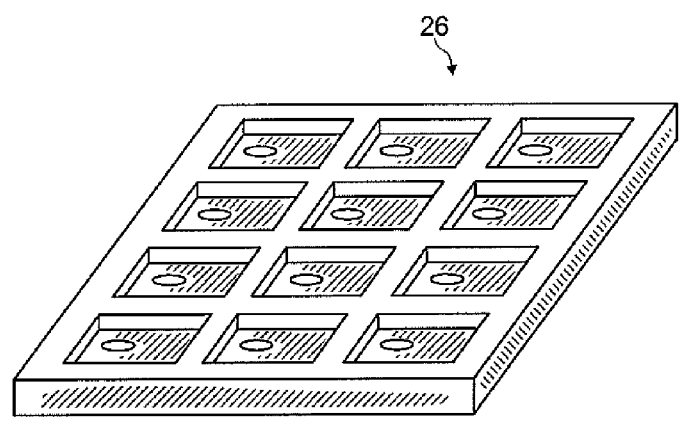
FIG. 6 is an elevated perspective view of the conductive polymer lid array used in the present invention.

Referring to FIGS. 1-6, a method of forming a semiconductor device 10 having a conductive polymer lid will be disclosed. As shown in FIG. 5, step 1, a lid member 26 is formed. The lid member 26 may be formed in an array structure as more clearly shown in FIG. 6. The lid member 26 is formed to have a top lid section 27. The top lid section 27 may have an approximately planar first surface 27A and an approximately planar second surface 27B opposing the first surface 26A. Side walls 29 may extend down from the second surface 27B to form the cavity 31. Additional compartmental walls 33 may extend down from the second surface 27B to form compartments 31A within the cavity 31.

The lid member 26 may be formed of a conductive polymer material. In accordance with one embodiment, a polymer material is mixed with conductive metal flakes to form the conductive polymer material. By using a conductive polymer material, the lid member 26 does not require any additional coating for RF shielding like the plastic lids used in the prior art. The lid member 26 may be formed by molding, printing, casting, and the like. The above mentioned methods are given as an example and should not be seen in a limiting manner.

Next, as shown in step 2 of FIG. 5, the sensor die 22 may be attached to the second surface 27B of the top lid section 27. The sensor die 22 is positioned on the second surface 27B and positioned over an opening 28 formed through the top lid section 27. The opening 28 allows the sensor die 22 to accurately receive signal. The sensor die 22 may be attached to the second surface 27B of the top lid section 27 by an adhesive 30. The adhesive 30 may be an adhesive paste, adhesive tape, or the like. The listing of the above is given as an example and should not be seen in a limiting manner.

Next, as shown in step 3 of FIG. 5, the control die 23 is electrically coupled to the first surface 12A of the base substrate 12. Different methods may be used to electrically couple the control die 23 to the substrate 12. Wirebonds, surface mount technology, through hole technology, flip chip technology, and the like may be used. The listing of the above is given as an example and should not be seen in a limiting manner. In the embodiment shown, the control die 23 is wirebonded to the metal traces 16 formed on the first surface 12A of the base substrate 12.

The sensor die 22 and the lid member 26 are then attached to the surface 12A of the base substrate 12. The lid member 26, with the sensor die 22 attached, are flipped over and attached to the surface 12A of the base substrate 12. The distal ends of the side walls 29 may be attach to the grounded metal traces 16A formed on the first surface 12A of the base substrate 12. A conductive adhesive 34 is applied to the grounded metal traces 16A to which the side walls 29 are to be attached. In accordance with one embodiment, the conductive adhesive 34 is a conductive epoxy, solder paste, or the like. Pressure is applied so that the distal ends of the side walls 29 are electrically coupled to the grounded metal traces 16A.

The lid member 26 may have a bump structure 35 formed on the distal end of the side walls 29. The bump structure 35 may be formed on a central area on a bottom surface of the side walls 29. The bump structure 35 allows one to control the Bond Line Thickness (BLT). This allows one to compensate for discrepancies and or in warpage in the lid member 26 when the lid member 26 was formed.

The sensor die 22 is attached to the substrate 12 via a stud bump process. Stud bumps 32 may be formed on bond pads 22A of the sensor die 22. In accordance with one embodiment, the stud bump 32 is a gold stud bump. The conductive adhesive 34 is applied to the metal traces 16 to which the sensor die 22 is to be attached. In accordance with one embodiment, the conductive adhesive 34 is a conductive epoxy, solder paste, or the like. The listing of the above is given as an example and should not be seen in a limiting manner. Pressure is applied so that the stud bumps 32 are electrically coupled to the metal trace 16.

As shown in step 5 of FIG. 5, the individual semiconductor devices 10 are then singulated. The individual semiconductor devices 10 may be singulated in different manners. In accordance with one embodiment, a saw device may be used to singulate the individual semiconductor devices 10. However, other methods may be used without departing from the spirit and scope of the present invention.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
   a base substrate having a plurality of metal traces;
   a conductive polymer cover having an opening formed on a top surface of the conductive polymer cover, the conductive polymer cover forming a cavity when attached to the base substrate;
   at least one die attached to an interior surface of the conductive polymer cover and positioned over the opening;
   an adhesive material applied on the at least one die to secure the at least one die to the interior surface of the conductive polymer cover over the opening to form an acoustic seal;
   wherein the conductive polymer cover and the at least one die are electrically coupled to metal traces on the first surface of the base substrate.

2. A semiconductor device in accordance with claim 1, further comprising a conductive adhesive material applied to the metal traces on a first surface of the base substrate to electrically couple the conductive polymer cover and the at least one die to the metal traces on a first surface of the base substrate.

3. A semiconductor device in accordance with claim 1, wherein the at least one die has a plurality of stud bumps, the stud bumps electrically coupled to the metal traces on a first surface of the base substrate.

4. A semiconductor device in accordance with claim 3, further comprising a conductive adhesive material applied to the metal traces on a first surface of the base substrate to electrically couple the plurality of stud bumps to the metal traces on a first surface of the base substrate.

5. A semiconductor device in accordance with claim 4, wherein the conductive adhesive material is one of a conductive epoxy, solder paste, or combinations thereof.

6. A semiconductor device in accordance with claim 1, further comprising a bump structure formed on the conductive polymer cover to control bond line thickness.

7. A semiconductor device in accordance with claim 1, wherein the cavity formed by the conductive polymer cover has a plurality of chambers.

8. A semiconductor device in accordance with claim 1, wherein the conductive polymer cover comprises:
   an approximately planer top member, the opening formed through the top member; and
   side walls extending down from an interior surface of the top member.

9. A semiconductor device in accordance with claim 8, wherein the conductive polymer cover further comprises a plurality of bump structures formed on a distal end of the side walls.

10. A semiconductor device in accordance with claim 8, wherein the conductive polymer cover further comprises at least one compartmental wall extending down from an interior surface of the top member.

11. A semiconductor device comprising:
    a substrate having a plurality of metal traces;
    a conductive polymer lid having an opening formed in a top section thereof, the conductive polymer lid attached to at least one grounded metal trace on a first surface of the substrate, the conductive polymer lid forming a cavity when attached to the substrate;
    a sensor die attached to an interior surface of the top section of the conductive polymer lid and positioned over the opening forming a seal over the opening;
    an adhesive applied on the sensor die to secure the sensor die to the interior surface of the conductive polymer lid over the opening to form an acoustic seal;
    a plurality of stud bumps formed on the sensor die and electrically coupled to at least one of the plurality of metal traces on the first surface of the substrate.

12. A semiconductor device in accordance with claim 11, further comprising a conductive adhesive material applied to the metal traces on the first surface of the substrate to electrically couple the conductive polymer lid and the sensor die to the metal traces on the first surface of the substrate.

13. A semiconductor device in accordance with claim 12, wherein the conductive adhesive material is one of a conductive epoxy, solder paste, or combinations thereof.

14. A semiconductor device in accordance with claim 11, further comprising a bump structure formed on the conductive polymer lid to control bond line thickness.

15. A semiconductor device in accordance with claim 11, wherein the cavity formed by the conductive polymer lid has a plurality of chambers.

16. A semiconductor device in accordance with claim 11, wherein the conductive polymer lid comprises:
    an approximately planer top member, the opening formed through the top member; and
    side walls extending down from an interior surface of the top member.

17. A semiconductor device in accordance with claim 16, wherein the conductive polymer lid further comprises a plurality of bump structures formed on a distal end of the side walls.

18. A semiconductor device in accordance with claim 16, wherein the conductive polymer lid further comprises at least one compartmental wall extending down from the interior surface of the top member.

19. A method of forming a semiconductor device comprising:
    forming a conductive polymer lid having an opening formed in a top surface thereof;
    attaching a semiconductor die to an interior of the top surface of the conductive polymer lid and over the opening to form a seal over the opening; and
    flip attaching the conductive polymer lid and the semiconductor die to a first surface of a substrate;
    wherein flip attaching the conductive polymer lid comprises:
    applying a conductive adhesive material to metal traces formed on the first surface of the substrate; and
    applying pressure to the conductive polymer lid to electrically couple side walls of the conductive polymer lid and solder bumps on the semiconductor die to the metal traces on the first surface of the substrate.

* * * * *